United States Patent
Chen et al.

(10) Patent No.: US 9,755,653 B2
(45) Date of Patent: Sep. 5, 2017

(54) PHASE DETECTOR

(71) Applicant: MEDIATEK Inc., Hsin-Chu (TW)

(72) Inventors: Pang-Ning Chen, Taipei (TW); Yu-Li Hsueh, New Taipei (TW); Pi-An Wu, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/737,603

(22) Filed: Jun. 12, 2015

(65) Prior Publication Data

US 2016/0126961 A1    May 5, 2016

Related U.S. Application Data

(60) Provisional application No. 62/075,371, filed on Nov. 5, 2014.

(51) Int. Cl.
| | |
|---|---|
| H03L 7/06 | (2006.01) |
| H03L 7/089 | (2006.01) |
| H03K 5/156 | (2006.01) |
| H03K 3/356 | (2006.01) |
| H03L 7/085 | (2006.01) |

(52) U.S. Cl.
CPC ....... H03L 7/089 (2013.01); H03K 3/356043 (2013.01); H03K 5/1565 (2013.01); H03L 7/085 (2013.01)

(58) Field of Classification Search
USPC .................. 327/147–149, 156–158
See application file for complete search history.

(56) References Cited

U.S. PATENT DOCUMENTS

| | | | |
|---|---|---|---|
| 7,092,474 B2 | 8/2006 | Cao | |
| 7,822,113 B2 | 10/2010 | Tonietto et al. | |
| 8,125,246 B2 | 2/2012 | Grochowski et al. | |
| 2002/0191727 A1* | 12/2002 | Staszewski | H03C 3/0966 375/376 |
| 2005/0110542 A1* | 5/2005 | Byun | H03L 7/085 327/158 |
| 2006/0022717 A1* | 2/2006 | Park | H03D 13/003 327/2 |
| 2011/0187413 A1* | 8/2011 | Suzuki | H03L 7/06 327/12 |
| 2012/0019293 A1* | 1/2012 | Guan | G11C 7/02 327/156 |
| 2012/0183104 A1* | 7/2012 | Hong | H03L 7/085 375/340 |

(Continued)

OTHER PUBLICATIONS

EP Search Report dated Mar. 14, 2016 in corresponding application (No. 15175185.6-1805).

*Primary Examiner* — Adam Houston

(74) *Attorney, Agent, or Firm* — McClure, Qualey & Rodack, LLP

(57) ABSTRACT

A phase detector including a first latch and a control circuit is provided. The first latch generates a first output signal and a second output signal in response to a phase difference between a first input signal and a second input signal. Each of the first and second output signals includes first phase information and second phase information of the phase difference. The control circuit generates a phase indicating signal in response to the first phase information of the phase difference. The phase indicating signal indicates a relative position between the first input signal and the second input signal.

32 Claims, 7 Drawing Sheets

(56) References Cited

U.S. PATENT DOCUMENTS

| | | | | |
|---|---|---|---|---|
| 2014/0210530 A1* | 7/2014 | Suzuki | ............... | H03L 7/0802 327/157 |
| 2015/0215110 A1* | 7/2015 | Chen | ................ | H03K 3/037 375/362 |
| 2015/0280722 A1* | 10/2015 | Liu | ................ | H03L 7/087 327/158 |
| 2016/0126961 A1* | 5/2016 | Chen | ................ | H03L 7/089 327/156 |

* cited by examiner

|     | T1 | T2 | T3 | T4 | T5 |
|-----|----|----|----|----|----|
| s1  | 0  | 1  | 1  | 0  | 0  |
| s2  | 0  | 0  | 1  | 1  | 0  |
| p1  | 0  | 1  | 1  | 0  | 0  |
| p2  | 0  | 0  | 0  | 1  | 0  |
| s1+s2 | 0 | 1 | 1 | 1 | 0 |
| $\overline{s1s2}$ | 1 | 1 | 0 | 1 | 1 |
| c1  | 1  | 1  | 0  | 0  | 1  |
| q1  | 1  | 0  | 1  | 1  | 1  |
| q2  | 1  | 1  | 1  | 1  | 1  |
| PD  | X  | 0  | 0  | 0  | 0  |

FIG. 7A

|     | T1 | T2 | T3 | T4 | T5 |
|-----|----|----|----|----|----|
| s1  | 0  | 0  | 1  | 1  | 0  |
| s2  | 0  | 1  | 1  | 0  | 0  |
| p1  | 0  | 0  | 0  | 1  | 0  |
| p2  | 0  | 1  | 1  | 0  | 0  |
| s1+s2 | 0 | 1 | 1 | 1 | 0 |
| $\overline{s1s2}$ | 1 | 1 | 0 | 1 | 1 |
| c1  | 1  | 1  | 0  | 0  | 1  |
| q1  | 1  | 1  | 1  | 1  | 1  |
| q2  | 1  | 0  | 1  | 1  | 1  |
| PD  | X  | 1  | 1  | 1  | 1  |

FIG. 7B

PHASE DETECTOR

This application claims the benefit of U.S. provisional application Ser. No. 62/075,371, filed Nov. 5, 2014, the subject matter of which is incorporated herein by reference.

FIELD OF THE INVENTION

The present invention relates to a phase detector, and more particularly, to a phase detector including a latch.

BACKGROUND OF THE INVENTION

Phase detectors may serve to detect the phase difference between two signals. Phase detectors are often used in phase-locked loop (PLL) systems or delay-locked loop (DLL) systems. Detecting phase difference is very important in many applications, such as in high-speed electronic devices and in telecommunication systems. With increasing operation frequency and higher precision requirement in modern electronic devices, there is a need for a fast yet accurate phase detector.

SUMMARY OF THE INVENTION

The disclosure is directed to a phase detector. One of the advantages of the phase detector is to provide the correct phase indicating signal very quickly.

In an embodiment, the phase detector includes a first latch and a control circuit. The first latch generates a first output signal and a second output signal in response to a phase difference between a first input signal and a second input signal. Each of the first and second output signals includes first phase information and second phase information of the phase difference. The control circuit generates a phase indicating signal in response to the first phase information of the phase difference. The phase indicating signal indicates a relative position between the first input signal and the second input signal.

In an embodiment, the first phase information corresponds to a phase difference between rising edges of the first and second input signals, and the second phase information corresponds to a phase difference between falling edges of the first and second input signals.

In an embodiment, the first phase information corresponds to a phase difference between falling edges of the first and second input signals, and the second phase information corresponds to a phase difference between rising edges of the first and second input signals.

In an embodiment, the control circuit includes a control logic and a second latch. The control logic filters out the second phase information from the first output signal and filters out the second phase information from the second output signal to generate a first filtered signal and a second filtered signal. The second latch generates the phase indicating signal with a second state in response to a first state of the first filtered signal and the second filtered signal.

In an embodiment, the control logic includes a computational logic and a gating logic. The computational logic generates a control signal in response to the first and second input signals. The gating logic filters out the second phase information from the first output signal to generate the first filtered signal in response to the control signal, and filters out the second phase information from the second output signal to generate the second filtered signal in response to the control signal.

In an embodiment, the computational logic includes a logic OR gate, a logic NAND gate, and a third latch. The logic OR gate receives the first input signal and the second input signal. The logic NAND gate receives the first input signal and the second input signal. The third latch generates the control signal in response to the output of the logic OR gate and the output of the logic NAND gate.

In an embodiment, the gating logic includes a first logic NAND gate and a second logic NAND gate. The first logic NAND gate generates the first filtered signal in response to the first output signal and the control signal. The second logic NAND gate generates the second filtered signal in response to the second output signal and the control signal.

In an embodiment, the control circuit includes a second latch and a control logic. The second latch generates first and second latched output signals with a second state in response to the first and second output signals with a first state. Each of the first and second latched output signals includes the first phase information and the second phase information. The control logic filters out the second phase information from the first latched output signal and filters out the second phase information from the second latched output signal to generate a first filtered signal and a second filtered signal. The phase indicating signal includes the first and second filtered signals.

In an embodiment, the control logic includes a computational logic and a gating logic. The computational logic generates a control signal in response to the first and second input signals. The gating logic filters out the second phase information from the first latched output signal to generate the first filtered signal in response to the control signal, and filters out the second phase information from the second latched output signal to generate the second filtered signal in response to the control signal.

In an embodiment, the control logic includes a computational logic and a gating logic. The computational logic generates a control signal in response to the first and second output signals. The gating logic filters out the second phase information from the first latched output signal to generate the first filtered signal in response to the control signal, and filters out the second phase information from the second latched output signal to generate the second filtered signal in response to the control signal.

In an embodiment, the control logic includes a computational logic and a gating logic. The computational logic generates a control signal in response to signals selected from the first and second input signals and the first and second output signals. The gating logic filters out the second phase information from the first latched output signal to generate the first filtered signal in response to the control signal, and filters out the second phase information from the second latched output signal to generate the second filtered signal in response to the control signal.

In an embodiment, the control logic further includes a multiplexer. The multiplexer selects the signals from the first and second input signals and the first and second output signals.

In an embodiment, a first duty cycle of the first input signal is different from a second duty cycle of the second input signal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 7A illustrates signal waveforms showing that the first input signal s1 leads the second input signal s2.

FIG. 7B illustrates signal waveforms showing that the first input signal s1 lags the second input signal s2.

Figure 1:
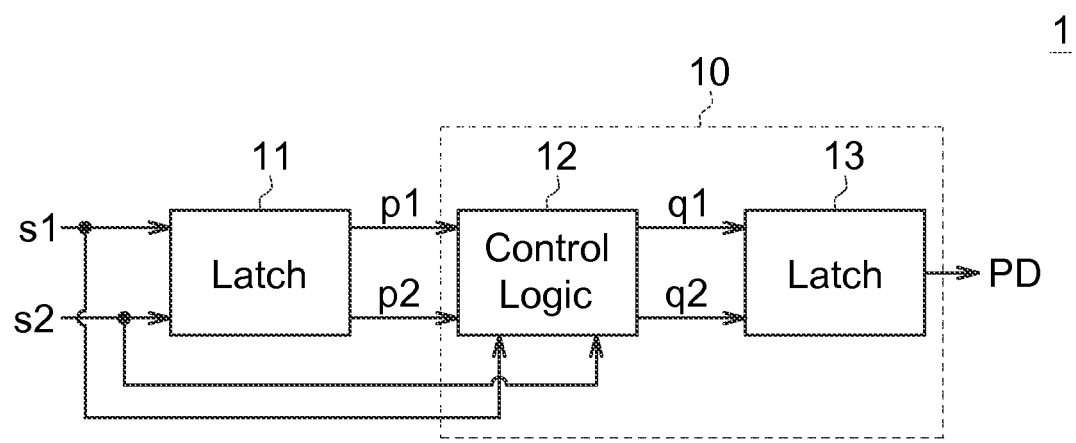
FIG. 1 illustrates a phase detector according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF PREFERRED EMBODIMENTS

FIG. 1 illustrates a phase detector 1 according to an embodiment of the invention. The phase detector 1 includes a first latch 11 and a control circuit 10. The first latch 11 generates a first output signal p1 and a second output signal p2 in response to a phase difference $\phi$ between a first input signal s1 and a second input signal s2. Each of the first output signal p1 and the second output signal p2 includes first phase information $\phi 1$ and second phase information $\phi 2$ of the phase difference $\phi$. The control circuit 10 generates a phase indicating signal PD in response to the first phase information $\phi 1$ of the phase difference $\phi$, wherein the phase indicating signal PD indicates a relative position between the first input signal s1 and the second input signal s2.

In one embodiment, the control circuit 10 includes a control logic 12 and a second latch 13. The control logic 12 filters out the second phase information $\phi 2$ from the first output signal p1 and filters out the second phase information $\phi 2$ from the second output signal p2 to generate a first filtered signal q1 and a second filtered signal q2. The second latch 13 generates the phase indicating signal PD with a second state in response to a first state of the first filtered signal q1 and the second filtered signal q2. The second latch 13 is configured to adjust a status of the first filtered signal q1 and the second filtered signal q2. The detailed description for the elements in the phase detector 1 is given below.

A latch is a circuit that has two stable states, e.g. logic level high and logic level low, and can be used to store state information. A latch may in general refer to both level-sensitive device and edge-triggered device. A latch usually has two input terminals and two output terminals, wherein the logic level at the two output terminals are opposite in polarity in a steady state. The latches in the present disclosure can be implemented by symmetric latches with symmetric structures. For a symmetric latch with two input terminals, the characteristics of signal paths (such as loading or path delay) originated from one input terminal are identical to the characteristics of signal paths originated from the other input terminal. Examples of symmetric latches include SR latch, JK latch, and other latches modified from a basic SR latch. The embodiment disclosed herein uses an SR latch as an example of the first latch 11 for explanation but is not limited thereto. Other types of symmetric latches may also be used in the phase detector 1.

Figure 2A:
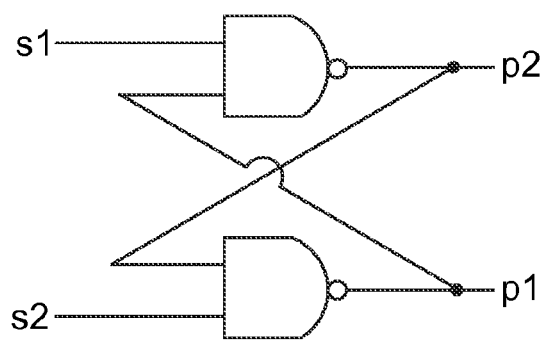
FIG. 2A-FIG. 2C illustrate three possible implementations of a latch.
Figure 2B:
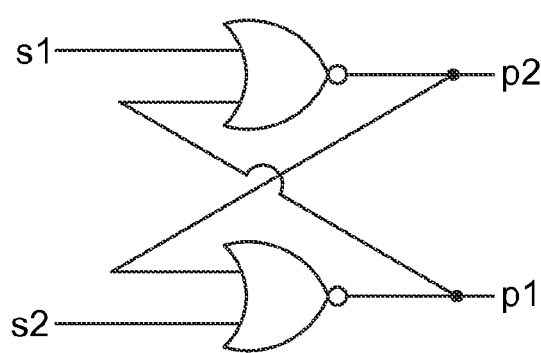
Figure 2C:
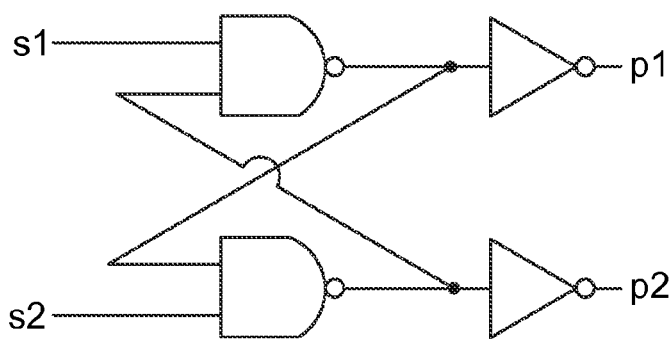

FIG. 2A, FIG. 2B and FIG. 2C illustrate three possible implementations of a latch. The first latch 11, being an SR latch in this embodiment, may be implemented by NAND gates or NOR gates, illustrated in FIG. 2A and FIG. 2B respectively. FIG. 2C shows an implementation similar to FIG. 2A with inverted outputs. The truth table of the SR latch 101 shown in FIG. 2A is given in Table 1, and the truth table of the SR latch 103 shown in FIG. 2C is given in Table 2. "Hold" means the output value remains the same as in the previous state.

TABLE 1

| s1 | s2 | p1 | p2 |
|----|----|----|----|
| 0 | 0 | 1 | 1 |
| 0 | 1 | 0 | 1 |
| 1 | 0 | 1 | 0 |
| 1 | 1 | Hold | Hold |

TABLE 2

| s1 | s2 | p1 | p2 |
|----|----|----|----|
| 0 | 0 | 0 | 0 |
| 0 | 1 | 0 | 1 |
| 1 | 0 | 1 | 0 |
| 1 | 1 | Hold | Hold |

Appropriate implementations may be adopted according to the design requirements and implementations of other logic blocks used in the phase detector 1. In this embodiment, the first latch 11 is implemented by the latch 103 shown in FIG. 2C, and the second latch 13 is implemented by the latch 101 shown in FIG. 2A. It should be noted that other implementations of symmetric latches may also be applicable.

Figures 3A, 3B, 4:
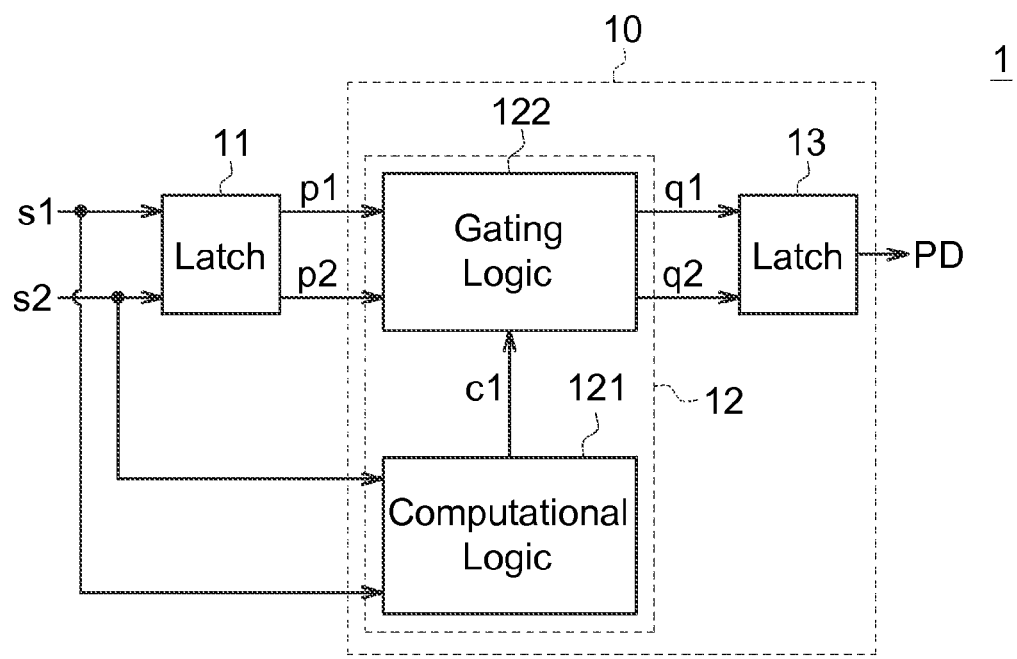
FIG. 3A and FIG. 3B illustrate signal waveforms of a latch.
FIG. 4 illustrates a phase detector according to an embodiment of the invention.

FIG. 3A and FIG. 3B illustrate signal waveforms of the latch 103 shown in FIG. 2C. The first latch 11 receives the first input signal s1 and the second input signal s2. In one embodiment, the first input signal s1 and the second input signal s2 are two clock signals with the same frequency and different phases. The first latch 11 may detect the phase difference $\phi$ between the first input signal s1 and the second input signal s2. FIG. 3A shows that the first input signal s1 leads the second input signal s2. Time T2 represents a time difference between a rising edge of the first input signal s1 and a rising edge of the second input signal s2. The first latch 11, being an SR latch in this embodiment, is in a set state in time T2, and hence the first output signal p1 equals 1 while the second output signal p2 equals 0. In time T3, both the input signals s1 and s2 are logic high. The SR latch is in a hold state and holds the previous value. Hence, the first and second output signals p1 and p2 remain the same logic values as in the previous state. Time T4 represents a time difference between a falling edge of the first input signal s1 and a falling edge of the second input signal s2. The first latch 11 is in a reset state in time T4, and hence the first output signal p1 equals 0 while the second output signal p2 equals 1.

As a consequence, the first output signal p1 rises at the beginning of time T2 and falls at the beginning of time T4. The second output signal p2 rises at the beginning of time T4. Since the time T2 and the time T4 correspond to the phase difference $\phi$ between the first and second input signals s1 and s2, information about the phase difference $\phi$ between the input signals s1 and s2 is obtained by the first and second output signals p1 and p2. The phase difference $\phi$ includes first phase information $\phi1$ and second phase information $\phi2$. The first phase information $\phi1$ corresponds to the phase difference between the rising edges of the input signals s1 and s2 (time T2). The second phase information $\phi2$ corresponds to the phase difference between the falling edges of the input signals s1 and s2 (time T4).

FIG. 3B shows that the first input signal s1 lags the second input signal s2. Similarly, the first latch 11 is in the reset state in time T2, the hold state in time T3, and the set state in time T4. The information about the phase difference $\phi$ between input signals s1 and s2 is also obtained by the first and second output signals p1 and p2. The phase difference $\phi$ includes the first phase information $\phi1$ and the second phase information $\phi2$. The first phase information $\phi1$ corresponds to the phase difference between the rising edges of the input signals s1 and s2 (time T2). The second phase information $\phi2$ corresponds to the phase difference between the falling edges of the input signals s1 and s2 (time T4). Since the phase difference $\phi$ between the first and second input signals s1 and s2 is obtained by the first and second output signals p1 and p2, whether the first input signals s1 leads or lags the second input signal s2 can be determined based on the first and second output signals p1 and p2.

In this embodiment, the second phase information $\phi2$ which corresponds to falling edges is deliberately filtered out. In other words, the phase indicating signal PD may be determined merely based on the first phase information $\phi1$, which corresponds to the phase difference between the rising edges of two input signals s1 and s2. Because the second phase information $\phi2$ is filtered out, the time difference between the falling edges of the first and second input signals s1 and s2 does not affect the phase indicating signal PD. The phase detector 1 can determine the phase indicating signal PD immediately after the rising edge deviation between the first and second input signals s1 and s2. Once the phase indicating signal PD is determined, the result remains a steady level regardless of the second phase information $\phi2$. No further signal processing on the phase indicating signal PD, such as accumulating or averaging, is required. Thus the phase detector 1 can generate the phase indicating signal PD very quickly.

In one embodiment, the control logic 12 filters out the second phase information $\phi2$ from the first and second output signals p1 and p2. The filtering process may depend on the status of the first and second input signals s1 and s2. There may be several ways to implement the control logic 12 for this filtering purpose.

FIG. 4 illustrates a phase detector 1 according to an embodiment of the invention. A possible implementation of the control logic 12 is shown in FIG. 4. The control logic 12 includes a computational logic 121 and a gating logic 122.

The computational logic 121 generates a control signal c1 in response to the first and second input signals s1 and s2. The gating logic 122 filters out the second phase information $\phi2$ from the first output signal p1 to generate the first filtered signal q1 in response to the control signal c1, and filters out the second phase information $\phi2$ from the second output signal p2 to generate the second filtered signal q2 in response to the control signal c1.

In this embodiment, the gating logic 122 may act as a blocking device to prevent the second phase information $\phi2$ from being propagated to the output side of the gating logic 122. The blocking device may be implemented by a logic gate with an appropriate control logic signal. For example, a logic 0 at one input terminal of a logic AND gate can prevent the information at the other input terminal of the logic AND gate from being propagated out. In this example, logic 0 is called a controlling value of the logic AND gate. The controlling value at one input terminal controls the output value of a logic gate, and hence prevents information at the other input terminal from being propagated out. The logic AND gate may also be replaced by a logic NAND gate in the above example. Another example is to apply logic 1 to one input terminal of a logic OR gate or a logic NOR gate where the controlling value is logic 1.

In this embodiment, the computational logic 121 generates the control signal c1 that controls the operation of the gating logic 122. Because the objective is to filter out the second phase information $\phi2$ corresponding to falling edge transitions, the control signal c1 is set to the controlling value at the time duration between the falling edges of the first and second input signal s1 and s2.

Figure 5:
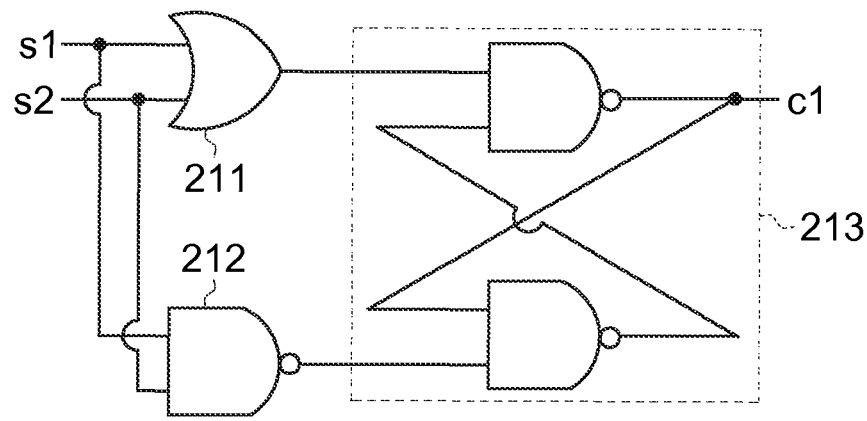
FIG. 5 illustrates a computational logic according to an embodiment of the invention.

FIG. 5 illustrates a computational logic 121 according to an embodiment of the invention. The computational logic 121 includes a logic OR gate 211, a logic NAND gate 212, and a latch 213. In one embodiment, the latch 213 may be implemented by a NAND-type SR latch, such as the latch 101 shown in FIG. 2A. The logic OR gate 211 receives the first input signal s1 via a first input terminal and receives the second input signal s2 via a second input terminal. The logic NAND gate 212 receives the first input signal s1 and the second input signal s2. An input terminal of the latch 213 is coupled to the output of the logic OR gate 211. The other input terminal of the latch 213 is coupled to the output of the logic NAND gate 212. The latch 213 generates the control signal c1 via an output terminal of the latch 213. According to the logic gates used in this embodiment, the control signal c1 is set to logic 0 at the time duration between the falling edges of the first and second input signal s1 and s2, such as time T4 shown in FIG. 3A and FIG. 3B. Logic 0 is the controlling value of logic AND gates and logic NAND gates. Therefore the gating logic 122 in this embodiment may be implemented by logic NAND gates such that the second phase information $\phi2$ is filtered out.

Figure 6:
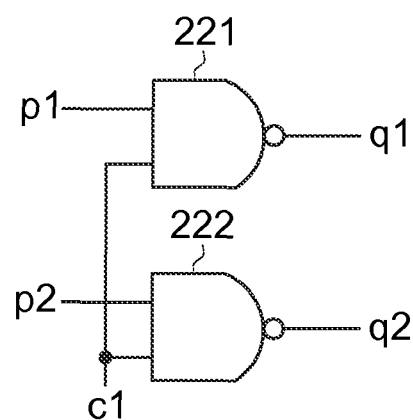
FIG. 6 illustrates a gating logic according to an embodiment of the invention.

FIG. 6 illustrates a gating logic 122 according to an embodiment of the invention. The gating logic 122 includes a first logic NAND gate 221 and a second logic NAND gate 222. The first logic NAND gate 221 receives the first output signal p1 and the control signal c1 to generate and output the first filtered signal q1. The second logic NAND gate 222 receives the second output signal p2 and the control signal c1 to generate and output the second filtered signal q2. A logic NAND gate is used as a gating device in this embodiment, therefore, when the control signal c1 equals 0, the information in the output signals p1 and p2 is not propagated to the filtered signals q1 and q2.

Since the gating logic 122 is used for preventing the second phase information $\phi2$ from being propagated, the control signal c1 can block the second phase information φ2 in the output signals p1 and p2 at the right time. Please refer to FIG. 4. In one embodiment, the path delay of the computational logic 121 is larger than the path delay of the first latch 11 so that the control signal c1 can be input to the gating logic 122 with correct timing. For example, the path delay of the computational logic 121 may be larger than the path delay of the first latch 11 by adopting appropriate gate sizing and/or loading parameters. In one embodiment, delay elements, such as multiple inverters connected in series, may also be used to assist the computational logic 121 in order to make the path delay of the computational logic 121 larger than the path delay of the first latch 11.

The second latch 13 is coupled to the gating logic 122 of the control logic 12 for receiving the first and second filtered signals q1 and q2 and generating the phase indicating signal PD. The phase indicating signal PD indicates whether the first input signal s1 leads or lags the second input signal s2. In one embodiment, the second latch 13 is implemented by a NAND-type SR latch, such as the latch shown in FIG. 2A. The second latch 13 generates the phase indicating signal PD with a second state in response to a first state of the first filtered signal q1 and the second filtered signal q2.

FIG. 7A illustrates signal waveforms showing that the first input signal s1 leads the second signal s2. Signals s1+s2 (OR operation), $\overline{s1s2}$ (NAND operation), and control signal c1 are generated by the computational logic 121. The control signal c1 is logic 0 in time T3 and T4. Please refer to the gating logic 122 in FIG. 6. The filtered signals q1 and q2 are thus logic 1 in time T3 and T4 regardless of the state of the output signals p1 and p2. Filtered signals q1 and q2 are fed into the second latch 13, and hence the second latch 13 is in the hold state in time T3 and T4. Note that the second latch 13 is also in the hold state in time T1 and T5. The second phase information φ2 does not affect the phase indicating signal PD because the second latch 13 is in the hold state in time T4. In other words, the phase indicating signal PD depends on the first phase information φ1 that corresponds to the phase difference between the rising edges of the first and second input signals s1 and s2. Once the result of the phase detection is determined, the second latch 13 remains in the hold state to provide an output signal with a steady level.

FIG. 7B illustrates signal waveforms showing that the first input signal s1 lags the second input signal s2. Similarly, the control signal c1 is logic 0 in time T3 and T4. Thus the second phase information φ2 does not affect the phase indicating signal PD because the second latch 13 is in the hold state in time T3 and T4. In FIG. 7A, no matter what the phase indicating signal PD is in time T1, the phase indicating signal PD becomes logic 0 starting from time T2 to indicate that the first input signal s1 leads the second input signal s2. 'X' in time T1 represents the phase indicating signal PD from a previous clock cycle, which may be either logic 0 or logic 1. In FIG. 7B, the phase indicating signal PD becomes logic 1 starting from time T2 to indicate that the first input signal s1 lags the second input signal s2. In other words, the phase indicating signal PD is correct immediately after the rising edge deviation between the first and second input signals s1 and s2. Moreover, the phase indicating signal PD remains a steady level thereafter. The phase indicating signal PD changes when the leading/lagging status between the rising edges of the first and second input signals s1 and s2 changes. As soon as the rising edge deviation is detected, the phase indicating signal PD shows the corresponding result and remains in a steady state thereafter. Therefore the phase detector 1 disclosed herein may be used in very high speed applications.

Moreover, the duty cycle of the first input signal s1 may be different from the duty cycle of the second input signal s2. In the example shown in FIG. 7A and FIG. 7B, the duty cycle of the input signal s1 is smaller than the duty cycle of the input signal s2 (time T2 is shorter than time T4). Because the second latch 13 is designed to be in the hold state in time T3, T4 and T5, the actual duration of time T4 does not affect the correctness of the phase indicating signal PD. That is, even if the duty cycles of the two input signals s1 and s2 are different (the duration of time T2 is different from the duration of time T4), the correct phase indicating signal PD can still be provided. In a conventional phase detector, a slight deviation of the duty cycle between the two input signals may result in a false result of the phase detection. The operation of the phase detector 1 disclosed herein is not affected by the difference of the duty cycles between the input signals.

The present disclosure relates to detecting the phase difference based on the rising edge of the input signals. However, it should be noted that the phase detector may also be modified as detecting the phase difference based on the falling edges of the input signals. That is, the first phase information φ1 may correspond to the phase difference between the falling edges of the input signals s1 and s2, and the second phase information φ2 may correspond to the phase difference between the rising edges of the first and second input signals s1 and s2. Possible circuit modifications include inverting input signals before the latching stage and/or using a NOR-type SR latch. Furthermore, implementations of the control logic 12 may vary. The gate type adopted depends on the circuit level of the latch. The logic circuit within the control logic 12 may be modified in order to meet the input/output condition of other circuitry in the phase detector. The implementation of the control logic 12 may be appropriately modified as long as the control logic 12 filters out the second phase information φ2 from the output signals p1 and p2.

It should be noted there are still other design alternatives for the phase detector disclosed herein. For example, the connecting order between individual building blocks and the signal connection relationship may be modified as long as the function of filtering out the second phase information is maintained.

Figure 8:
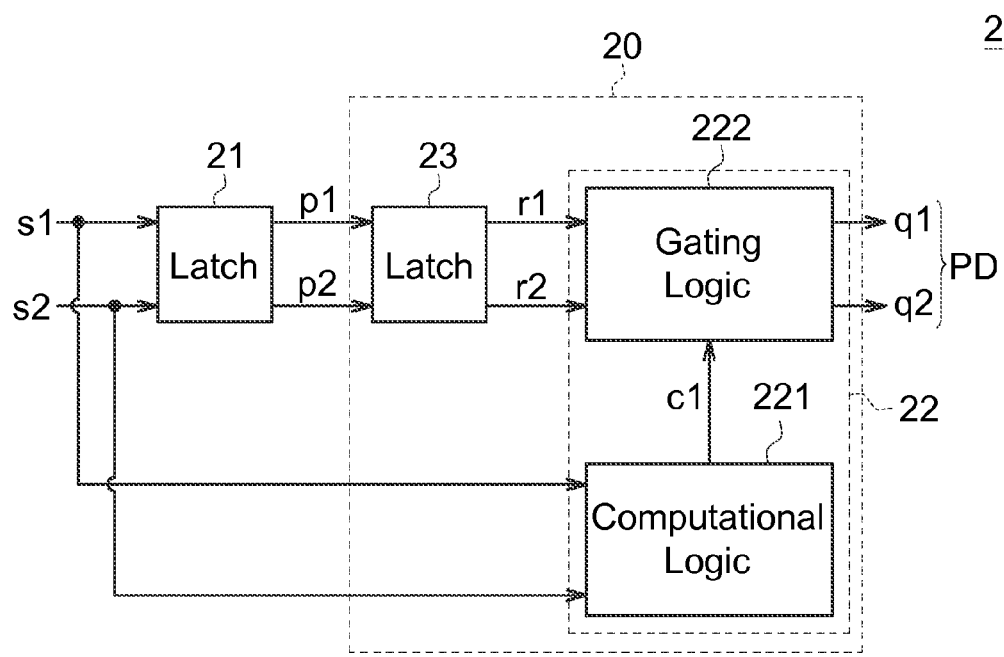
FIG. 8 illustrates a phase detector according to an embodiment of the invention.

FIG. 8 illustrates a phase detector 2 according to an embodiment of the invention. The phase detector 2 includes a first latch 21 and a control circuit 20. The first latch 21 generates a first output signal p1 and a second output signal p2 in response to a phase difference φ between a first input signal s1 and a second input signal s2. Each of the first output signal p1 and the second output signal p2 includes first phase information φ1 and second phase information φ2 of the phase difference cp. The control circuit 20 generates a phase indicating signal PD in response to the first phase information φ1 of the phase difference φ, wherein the phase indicating signal PD indicates a relative position between the first input signal s1 and the second input signal s2.

In one embodiment, the control circuit 20 includes a control logic 22 and a second latch 23. The second latch 23 generates first and second latched output signals r1 and r2 with a second state (such as hold state) in response to the first and second output signals p1 and p2 with a first state (such as set state or reset state), wherein each of the first and second latched output signals r1 and r2 includes the first phase information φ1 and the second phase information φ2.

The control logic 22 filters out the second phase information $\phi 2$ from the first latched output signal r1 and filters out the second phase information $\phi 2$ from the second latched output signal r2 to generate a first filtered signal q1 and a second filtered signal q2, wherein the phase indicating signal PD includes the first and second filtered signals q1 and q2. In one embodiment, the first filtered signal q1 is an inverse of the second filtered signal q2. For example, when the first input signal s1 leads the second input signal s2, the first filtered signal q1 is 1 and the second filtered signal q2 is 0. When the first input signal s1 lags the second input signal s2, the first filtered signal q1 is 0 and the second filtered signal q2 is 1. Therefore the phase indicating signal PD, including the first filtered signal q1 and the second filtered signal q2, indicates the relative position between the first input signal s1 and the second input signal s2.

The difference between the phase detector 2 shown in FIG. 8 and the phase detector 1 shown in FIG. 1 is the connecting order between the control logic 22 and the second latch 23. The function of filtering out the second phase information $\phi 2$ is maintained by appropriately modifying the circuit elements. The second phase information $\phi 2$ may correspond to either the rising edge transition or the falling edge transition.

The control logic 22 includes a computational logic 221 and a gating logic 222. The computational logic 221 generates a control signal c1 in response to the first and second input signals s1 and s2. The gating logic 222 filters out the second phase information $\phi 2$ from the first latched output signals r1 to generate the first filtered signal q1 in response to the control signal c1, and filters out the second phase information $\phi 2$ from the second latched output signals r2 to generate the second filtered signal q2 in response to the control signal c1.

The first and second latches 21 and 23 may be SR latches. The operation of the phase detector 2 is similar to that of the phase detector 1, and thus the detailed description is not repeated here. The gate types adopted may also be the same as those in the phase detector 1. For example, the computational logic 221 may include a logic OR gate receiving first and second input signals s1 and s2, a logic NAND gate receiving first and second input signals s1 and s2, and a latch. The gating logic 222 may include a first logic NAND gate and a second logic NAND gate. The duty cycle of the first input signal s1 may also be different from the duty cycle of the second input signal s2. The phase indicating signal PD is not affected by the different duty cycles.

Figure 9:
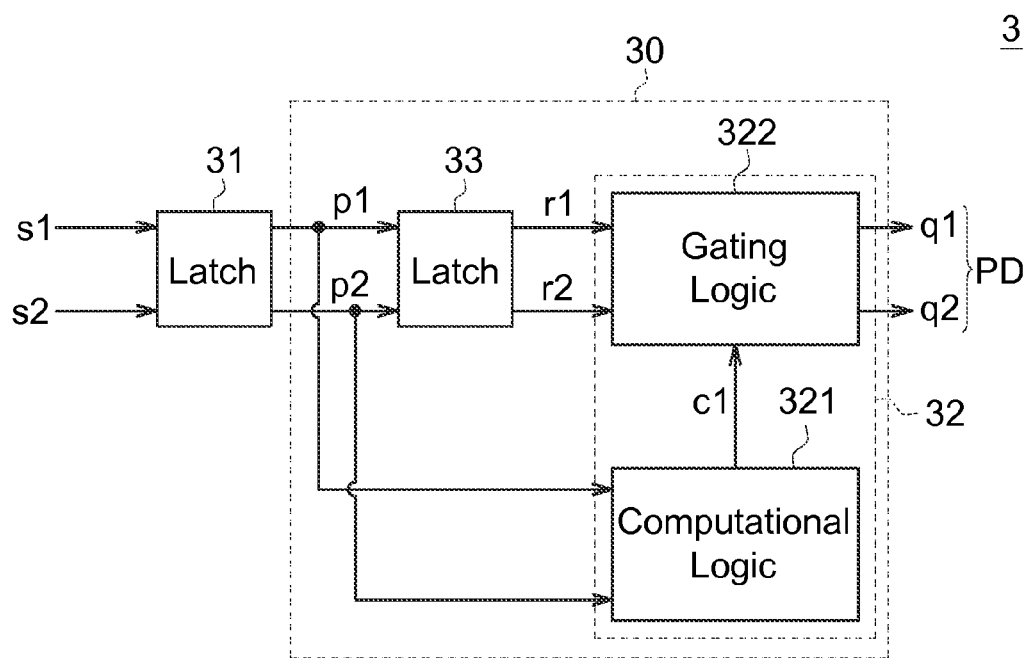
FIG. 9 illustrates a phase detector according to an embodiment of the invention.

FIG. 9 illustrates a phase detector 3 according to an embodiment of the invention. The phase detector 3 includes a first latch 31 and a control circuit 30. In one embodiment, the control circuit 30 includes a control logic 32 and a second latch 33. The function of filtering out the second phase information $\phi 2$ is maintained by appropriately modifying the circuit elements. The second phase information $\phi 2$ may correspond to either the rising edge transition or the falling edge transition.

The control logic 32 includes a computational logic 321 and a gating logic 322. The computational logic 321 generates a control signal c1 in response to the first and second output signals p1 and p2. The gating logic 322 filters out the second phase information $\phi 2$ from the first latched output signal r1 to generate the first filtered signal q1 in response to the control signal c1, and filters out the second information $\phi 2$ from the second latched output signal r2 to generate the second filtered signal q2 in response to the control signal c1.

The difference between the phase detector 3 and the phase detector 2 is the signal that controls the control logic. In the phase detector 2, the control logic 22 is controlled by the input signals s1 and s2, while in the phase detector 3, the control logic 32 is controlled by the output signals p1 and p2. Except for the difference, the operation of the phase detector 3 is similar and thus the detailed description is not repeated here. The gate types used in the control logic 32 may also be the same as those used in the control logic 22. For example, the computational logic 321 may include a logic OR gate receiving the first and second output signals p1 and p2, a logic NAND gate receiving the first and second output signals p1 and p2, and a latch. The actual gate level implementation of the control logic 32 may also vary to accommodate the difference in signal connection relationship. The function of filtering out the second phase information $\phi 2$ is maintained.

Figure 10:
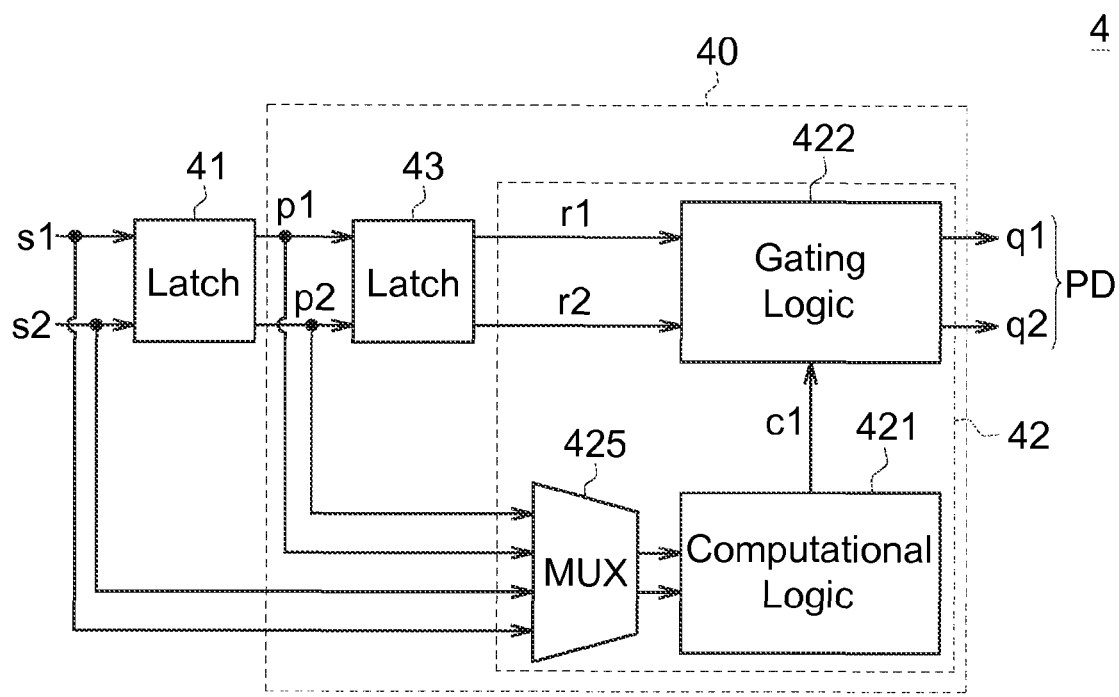
FIG. 10 illustrates a phase detector according to an embodiment of the invention.

FIG. 10 illustrates a phase detector 4 according to an embodiment of the invention. The phase detector 4 includes a first latch 41 and a control circuit 40. The control circuit 40 includes a control logic 42 and a second latch 43. The control logic 42 includes a computational logic 421 and a gating logic 422. The computational logic 421 generates a control signal c1 in response to signals selected from the first and second input signals s1 and s2 and the first and second output signals p1 and p2. The gating logic 422 filters out the second phase information $\phi 2$ from the first latched output signal r1 to generate the first filtered signal q1 in response to the control signal c1, and filters out the second information $\phi 2$ from the second latched output signal r2 to generate the second filtered signal q2 in response to the control signal c1.

In one embodiment, the control logic 42 further includes a multiplexer 425. The multiplexer 425 selects the signals from the first and second input signals s1 and s2 and the first and second output signals p1 and p2. Thus the computational logic 421 may be controlled either by the first and second input signals s1 and s2 or by the first and second output signals p1 and p2. The operation of the phase detector 4 is similar to that of phase detector 2 and phase detector 3 and thus the detailed description is not repeated here.

To sum up, the phase detector disclosed herein is structurally symmetric. Because the signal paths of two input signals are symmetric, no extra matching circuit is required, and hence zero offset phase detector can be accomplished. The phase detector circuit is also insensitive to Process-Voltage-Temperature (PVT) variation due to the symmetric structure. In addition, because one part of the phase difference information is held while another part of the phase difference information is neglected, only one clock cycle is required to provide a phase leading/lagging result, and also the output phase indicating signal can remain a steady voltage level. Fast and accurate phase indicating signal can be provided. Furthermore, the phase detector disclosed herein is able to provide correct result even in the presence of duty cycle deviation between two input signals.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A phase detector, comprising:
   a first latch, for generating a first output signal and a second output signal in response to a phase difference between a first input signal and a second input signal, wherein each of the first and second output signals comprises first phase information and second phase information of the phase difference; and a control circuit, for filtering out the second phase information of the phase difference and generating a phase indicating signal in response to the first phase information of the phase difference, wherein the phase indicating signal indicates a relative position between the first input signal and the second input signal.

2. The phase detector of claim 1, wherein the first phase information corresponds to a phase difference between rising edges of the first and second input signals, and the second phase information corresponds to a phase difference between falling edges of the first and second input signals.

3. The phase detector of claim 1, wherein the first phase information corresponds to a phase difference between falling edges of the first and second input signals, and the second phase information corresponds to a phase difference between rising edges of the first and second input signals.

4. The phase detector of claim 1, wherein the control circuit comprises:

a control logic, for filtering out the second phase information from the first output signal and filtering out the second phase information from the second output signal to generate a first filtered signal and a second filtered signal; and a second latch, for generating the phase indicating signal with a second state in response to a first state of the first filtered signal and the second filtered signal.

5. The phase detector of claim 4, wherein the control logic comprises:

a computational logic, for generating a control signal in response to the first and second input signals; and a gating logic, for filtering out the second phase information from the first output signal to generate the first filtered signal in response to the control signal, and filtering out the second phase information from the second output signal to generate the second filtered signal in response to the control signal.

6. The phase detector of claim 5, wherein the computational logic comprises:

a logic OR gate, for receiving the first input signal and the second input signal;

a logic NAND gate, for receiving the first input signal and the second input signal; and a third latch, for generating the control signal in response to the output of the logic OR gate and the output of the logic NAND gate.

7. The phase detector of claim 5, wherein the gating logic comprises:

a first logic NAND gate, for generating the first filtered signal in response to the first output signal and the control signal; and a second logic NAND gate, for generating the second filtered signal in response to the second output signal and the control signal.

8. The phase detector of claim 1, wherein the control circuit comprises:

a second latch, for generating first and second latched output signals with a second state in response to the first and second output signals with a first state, wherein each of the first and second latched output signals comprises the first phase information and the second phase information; and a control logic, for filtering out the second phase information from the first latched output signal and filtering out the second phase information from the second latched output signal to generate a first filtered signal and a second filtered signal, wherein the phase indicating signal comprises the first and second filtered signals.

9. The phase detector of claim 8, wherein the control logic comprises:

a computational logic, for generating a control signal in response to the first and second input signals; and a gating logic, for filtering out the second phase information from the first latched output signal to generate the first filtered signal in response to the control signal, and filtering out the second phase information from the second latched output signal to generate the second filtered signal in response to the control signal.

10. The phase detector of claim 9, wherein the computational logic comprises:

a logic OR gate, for receiving the first input signal and the second input signal;

a logic NAND gate, for receiving the first input signal and the second input signal; and a third latch, for generating the control signal in response to the output of the logic OR gate and the output of the logic NAND gate.

11. The phase detector of claim 9, wherein the gating logic comprises:

a first logic NAND gate, for generating the first filtered signal in response to the first latched output signal and the control signal; and a second logic NAND gate, for generating the second filtered signal in response to the second latched output signal and the control signal.

12. The phase detector of claim 8, wherein the control logic comprises:

a computational logic, for generating a control signal in response to the first and second output signals; and a gating logic, for filtering out the second phase information from the first latched output signal to generate the first filtered signal in response to the control signal, and filtering out the second phase information from the second latched output signal to generate the second filtered signal in response to the control signal.

13. The phase detector of claim 12, wherein the computational logic comprises:

a logic OR gate, for receiving the first output signal and the second output signal;

a logic NAND gate, for receiving the first output signal and the second output signal; and a third latch, for generating the control signal in response to the output of the logic OR gate and the output of the logic NAND gate.

14. The phase detector of claim 12, wherein the gating logic comprises:

a first logic NAND gate, for generating the first filtered signal in response to the first latched output signal and the control signal; and a second logic NAND gate, for generating the second filtered signal in response to the second latched output signal and the control signal.

15. The phase detector of claim 8, wherein the control logic comprises:

a computational logic, for generating a control signal in response to signals selected from the first and second input signals and the first and second output signals; and a gating logic, for filtering out the second phase information from the first latched output signal to generate the first filtered signal in response to the control signal, and filtering out the second phase information from the second latched output signal to generate the second filtered signal in response to the control signal.

16. The phase detector of claim 15, wherein the control logic further comprises:
a multiplexer, for selecting the signals from the first and second input signals and the first and second output signals.

17. The phase detector of claim 16, wherein the computational logic comprises:
a logic OR gate, for receiving the outputs of the multiplexer;
a logic NAND gate, for receiving the outputs of the multiplexer; and
a third latch, for generating the control signal in response to the output of the logic OR gate and the output of the logic NAND gate.

18. The phase detector of claim 15, wherein the gating logic comprises:
a first logic NAND gate, for generating the first filtered signal in response to the first latched output signal and the control signal; and
a second logic NAND gate, for generating the second filtered signal in response to the second latched output signal and the control signal.

19. The phase detector of claim 1, wherein a duty cycle of the first input signal is different from a duty cycle of the second input signal.

20. A phase detector, comprising:
a first latch, for generating a first output signal and a second output signal in response to a phase difference between a first input signal and a second input signal, wherein each of the first and second output signals comprises first phase information and second phase information of the phase difference; and
a control circuit, for receiving the first input signal and the second input signal, and generating a phase indicating signal in response to the first phase information of the phase difference, wherein the phase indicating signal indicates a relative position between the first input signal and the second input signal.

21. The phase detector of claim 20, wherein the control circuit comprises:
a control logic, for receiving the first input signal and the second input signal, filtering out the second phase information from the first output signal, and filtering out the second phase information from the second output signal to generate a first filtered signal and a second filtered signal; and
a second latch, for generating the phase indicating signal with a second state in response to a first state of the first filtered signal and the second filtered signal.

22. The phase detector of claim 21, wherein the control logic comprises:
a computational logic, for receiving the first input signal and the second input signal, and generating a control signal in response to the first and second input signals; and
a gating logic, for filtering out the second phase information from the first output signal to generate the first filtered signal in response to the control signal, and filtering out the second phase information from the second output signal to generate the second filtered signal in response to the control signal.

23. The phase detector of claim 22, wherein the computational logic comprises:
a logic OR gate, for receiving the first input signal and the second input signal;
a logic NAND gate, for receiving the first input signal and the second input signal; and
a third latch, for generating the control signal in response to the output of the logic OR gate and the output of the logic NANND gate.

24. The phase detector of claim 22, wherein the gating logic comprises:
a first logic NAND gate, for generating the first filtered signal in response to the first output signal and the control signal; and
a second logic NANND gate, for generating the second filtered signal in response to the second output signal and the control signal.

25. The phase detector of claim 20, wherein the control circuit comprises:
a second latch, for generating first and second latched output signals with a second state in response to the first and second output signals with a first state, wherein each of the first and second latched output signals comprises the first phase information and the second phase information; and
a control logic, for receiving the first input signal and the second input signal, filtering out the second phase information from the first latched output signal, and filtering out the second phase information from the second latched output signal to generate a first filtered signal and a second filtered signal, wherein the phase indicating signal comprises the first and second filtered signals.

26. The phase detector of claim 25, wherein the control logic comprises:
a computational logic, for receiving the first input signal and the second input signal, and generating a control signal in response to the first and second input signals; and
a gating logic, for filtering out the second phase information from the first latched output signal to generate the first filtered signal in response to the control signal, and filtering out the second phase information from the second latched output signal to generate the second filtered signal in response to the control signal.

27. The phase detector of claim 26, wherein the computational logic comprises:
a logic OR gate, for receiving the first input signal and the second input signal;
a logic NAND gate, for receiving the first input signal and the second input signal; and
a third latch, for generating the control signal in response to the output of the logic OR gate and the output of the logic NAND gate.

28. The phase detector of claim 26, wherein the gating logic comprises:
a first logic NAND gate, for generating the first filtered signal in response to the first latched output signal and the control signal; and
a second logic NAND gate, for generating the second filtered signal in response to the second latched output signal and the control signal.

29. The phase detector of claim 25, wherein the control logic comprises:
a computational logic, for generating a control signal in response to signals selected from the first and second input signals and the first and second output signals; and a gating logic, for filtering out the second phase information from the first latched output signal to generate the first filtered signal in response to the control signal, and filtering out the second phase information from the second latched output signal to generate the second filtered signal in response to the control signal.

30. The phase detector of claim 29, wherein the control logic further comprises:
   a multiplexer, for selecting the signals from the first and second input signals and the first and second output signals.

31. The phase detector of claim 30, wherein the computational logic comprises:
   a logic OR gate, for receiving the outputs of the multiplexer;
   a logic NAND gate, for receiving the outputs of the multiplexer; and
   a third latch, for generating the control signal in response to the output of the logic OR gate and the output of the logic NAND gate.

32. The phase detector of claim 29, wherein the gating logic comprises:
   a first logic NAND gate, for generating the first filtered signal in response to the first latched output signal and the control signal; and
   a second logic NAND gate, for generating the second filtered signal in response to the second latched output signal and the control signal.

* * * * *